United States Patent
Majkowski et al.

(10) Patent No.: US 12,267,056 B2
(45) Date of Patent: Apr. 1, 2025

(54) COMMUNICATIONS SYSTEM INCLUDING SELECTABLE IMPEDANCE USING AN ALTERNATING PULSE WIDTH MODULATION SCHEME AND RELATED METHODS

(71) Applicant: L3Harris Global Communications, Inc., Albany, NY (US)

(72) Inventors: Joseph D. Majkowski, Pittsford, NY (US); Thomas Michael DiSanto, Churchville, NY (US)

(73) Assignee: L3HARRIS GLOBAL COMMUNICATIONS, INC., Albany, NY (US)

( * ) Notice: Subject to any disclaimer, the term of this patent is extended or adjusted under 35 U.S.C. 154(b) by 572 days.

(21) Appl. No.: 17/543,984

(22) Filed: Dec. 7, 2021

(65) Prior Publication Data

US 2023/0179163 A1     Jun. 8, 2023

(51) Int. Cl.
H03H 2/00     (2006.01)
H01Q 1/24     (2006.01)
H03H 11/30    (2006.01)
H04L 25/49    (2006.01)

(52) U.S. Cl.
CPC ............ *H03H 2/005* (2013.01); *H01Q 1/243* (2013.01); *H03H 11/30* (2013.01); *H04L 25/4902* (2013.01)

(58) Field of Classification Search
CPC ........ H03H 2/005; H03H 11/30; H01Q 1/243; H04L 25/4902
USPC ................. 375/238, 257, 295, 297, 316, 340
See application file for complete search history.

(56) References Cited

U.S. PATENT DOCUMENTS

| | | | |
|---|---|---|---|
| 2,470,307 A | 5/1949 | Guenella | |
| 3,601,734 A | 8/1971 | Chesney | |
| 3,614,676 A | 10/1971 | Boelke | |
| 4,193,076 A * | 3/1980 | Ito | H01Q 7/08 |
| | | | 343/788 |
| 4,433,132 A | 2/1984 | Rogers | |
| 6,121,940 A | 9/2000 | Skahill et al. | |

(Continued)

FOREIGN PATENT DOCUMENTS

| EP | 0384258 | 8/1990 |
|---|---|---|
| WO | 2010059450 | 5/2010 |

OTHER PUBLICATIONS

George Ploussios, The ETH (Electronically Tuned Helix) Antenna; IEEE Microwave Journal; Published 1995 under Publication# 0-7803-2479-7; pp. 1267-1272.

(Continued)

*Primary Examiner* — Emmanuel Bayard
(74) *Attorney, Agent, or Firm* — ALLEN, DYER, DOPPELT, + GILCHRIST, P.A.

(57) ABSTRACT

A communications system may include radio frequency (RF) circuitry, an antenna assembly, and an RF cable coupling the RF circuitry and the antenna assembly. The antenna assembly may include an antenna and RF impedance selection circuitry coupled thereto. The RF circuitry may be configured to communicate RF signals with the antenna via the RF cable, and communicate RF impedance selection signals to the RF impedance selection circuitry via the RF cable and using an alternating pulse width modulation scheme.

22 Claims, 7 Drawing Sheets

(56) References Cited

U.S. PATENT DOCUMENTS

| | | | |
|---|---|---|---|
| 6,716,165 B1 * | 4/2004 | Flanders | A61B 5/0006 |
| | | | 600/509 |
| 6,763,222 B1 * | 7/2004 | Bukhari | H04B 7/18528 |
| | | | 455/3.02 |
| 6,847,140 B2 | 1/2005 | Kimberlin et al. | |
| 7,616,934 B2 | 11/2009 | Macphail | |
| 7,944,807 B2 | 5/2011 | Robinson, Jr. | |
| 8,786,372 B2 | 7/2014 | Tattershall et al. | |
| 9,231,799 B2 * | 1/2016 | Roper | H04B 5/24 |
| 9,460,321 B1 * | 10/2016 | Brocato | H03D 1/00 |
| 9,639,500 B2 | 5/2017 | Bas et al. | |
| 10,181,832 B1 * | 1/2019 | Alvey | H03F 3/245 |
| 2003/0030426 A1 * | 2/2003 | Pickerd | G01R 27/28 |
| | | | 324/76.58 |
| 2004/0070541 A1 * | 4/2004 | Andersson | H01Q 1/085 |
| | | | 343/702 |
| 2005/0057404 A1 * | 3/2005 | Demicco | H01Q 1/088 |
| | | | 343/702 |
| 2007/0232248 A1 * | 10/2007 | Kasha | H04B 1/04 |
| | | | 455/121 |
| 2011/0260819 A1 | 10/2011 | Yeh et al. | |
| 2012/0223709 A1 * | 9/2012 | Schillak | G01R 33/3621 |
| | | | 324/309 |
| 2013/0187826 A1 | 7/2013 | Hutcheson | |
| 2014/0133525 A1 * | 5/2014 | Desclos | H04B 1/40 |
| | | | 375/238 |
| 2015/0074306 A1 | 3/2015 | Ayyagari et al. | |
| 2015/0312058 A1 * | 10/2015 | Black | H04B 1/0458 |
| | | | 455/77 |
| 2016/0241302 A1 * | 8/2016 | Zhao | H04B 3/23 |
| 2018/0026358 A1 * | 1/2018 | Johnson | H01Q 1/44 |
| | | | 343/702 |
| 2020/0403647 A1 * | 12/2020 | Bit-Babik | H01Q 1/362 |
| 2021/0084251 A1 * | 3/2021 | Gollakota | H04N 5/40 |
| 2022/0320750 A1 * | 10/2022 | Wu | H01Q 3/32 |
| 2023/0091264 A1 * | 3/2023 | Rouaissia | H01Q 1/48 |
| | | | 343/700 R |

OTHER PUBLICATIONS

Min-Lin Chuang; A Microwave Switched-Ban Impedance Transformer for Frequency-Dependent Complex Load; Abstract from Cambridge Core International Journal of Microwave and Wireless Technologies; vol. 13, Issue 3 published Aug. 3, 2020.

Raos et al., OFDM-CDMA HF Modem with Self-Interference Cancellation; Publication of Universidad de Las Palmas de Gran Canarias, Spain; Conference Paper dated Nov. 2003; entire document.

* cited by examiner

COMMUNICATIONS SYSTEM INCLUDING SELECTABLE IMPEDANCE USING AN ALTERNATING PULSE WIDTH MODULATION SCHEME AND RELATED METHODS

TECHNICAL FIELD

The present invention relates to the field of electronics, and more particularly, to radio frequency (RF) communications, and related methods.

BACKGROUND

In electronics, it may be desirable to match impedance, for example, to obtain maximum power transfer between a source and a load. In an implementation example of wireless communications device, it may be desirable that radio frequency (RF) circuitry, for example, that generates RF signals, impedance match the coupled antenna assembly and RF cable coupling antenna assembly coupled to the antenna assembly and RF circuitry.

U.S. Pat. No. 9,639,500 is directed to a method of data transmission over a single-wire bus. The method includes transmitting, according to a first communication channel arranged for transmission of first channel data values, a plurality of pulses of different durations according to the first channel data values, each of the different durations depending on a reference duration, the reference duration defining a reference pulse that occurs before transmitting the first channel data. The method also includes transmitting, according to a second communication channel arranged for transmission of second channel data values, at least one signal level according to at least one second channel data value, the transmission of second channel data values concurrent with transmission of a reference pulse associated with the transmission of the first channel data values. The reference duration is selected from a set of reference durations based on the second channel data values, and the reference duration is variable during transmission of the first and second channel data values.

Electrically short tuned antenna elements, for example, on a wireless communications device, such as a mobile wireless communications device, may present varying impedance values as a function of size relative to wavelength. To address desired performance it may be desirable to use multiple inductor-capacitor (LC) matching networks.

U.S. Pat. No. 7,616,934 is directed to a method of providing an impedance match for an integrated semiconductor circuit to other microwave elements is provided by allowing the selection of one of a plurality of impedance matching ratios between the circuit and other elements. The tunable impedance match comprises a microwave impedance transformer with at least a single primary winding, and a plurality of secondary windings. The winding configuration is determined by an electrical switching apparatus allowing the secondary windings to be connected in series, parallel and combinations thereof to provide the required impedance matching. The method allows for both dynamic matching of an integrated semiconductor circuit for increased efficiency, and hence reduced power consumption, and directly matching said circuit to high impedance antennae, etc.

Still, further improvements to impedance matching, for example, over single-wire interfaces, for wireless communication are desired.

SUMMARY

A communications system may include radio frequency (RF) circuitry, an antenna assembly, and an RF cable coupling the RF circuitry and the antenna assembly. The antenna assembly may include an antenna and RF impedance selection circuitry coupled thereto. The RF circuitry may be configured to communicate RF signals with the antenna via the RF cable, and communicate RF impedance selection signals to the RF impedance selection circuitry via the RF cable and using an alternating pulse width modulation scheme.

The RF impedance selection circuitry may include an impedance transformer and a plurality of switches coupled to the impedance transformer. The plurality of switches may include a plurality of microelectromechanical (MEMS) switches, for example.

The RF circuitry may be configured to modulate, using the alternating pulse width modulation scheme, the RF impedance selection signals based upon transitions between low and high signal values. The RF impedance selection circuitry may be configured to demodulate the modulated RF impedance selection signals based upon the transitions between the low and high signal values, for example.

The RF impedance selection circuitry may be configured to determine corresponding RF impedance selection signal symbol values based upon the transitions between the low and high signal values and a lookup table, for example. The antenna assembly may include a direct current (DC) blocking element between the impedance selection circuitry and the RF cable.

The RF cable may include a coaxial cable, for example. The communications system may include a first housing carrying the RF circuitry, and the antenna assembly may include a second housing carrying the antenna and RF impedance selection circuitry.

A method aspect is directed to a method of communicating using a communications system comprising radio frequency (RF) circuitry, an antenna assembly, and an RF cable coupling the RF circuitry and the antenna assembly. The method may include operating the RF circuitry to communicate RF signals with an antenna of the antenna assembly via the RF cable. The method may also include operating the RF circuitry to communicate RF impedance selection signals to RF impedance selection circuitry of the antenna assembly via the RF cable and using an alternating pulse width modulation scheme.

DETAILED DESCRIPTION

The present invention will now be described more fully hereinafter with reference to the accompanying drawings, in which preferred embodiments of the invention are shown. This invention may, however, be embodied in many different forms and should not be construed as limited to the embodiments set forth herein. Rather, these embodiments are provided so that this disclosure will be thorough and complete, and will fully convey the scope of the invention to those skilled in the art. Like numbers refer to like elements throughout, and prime notation is used to indicate similar elements in alternative embodiments. Prime notation is used to refer to like elements in different embodiments.

Figure 1:
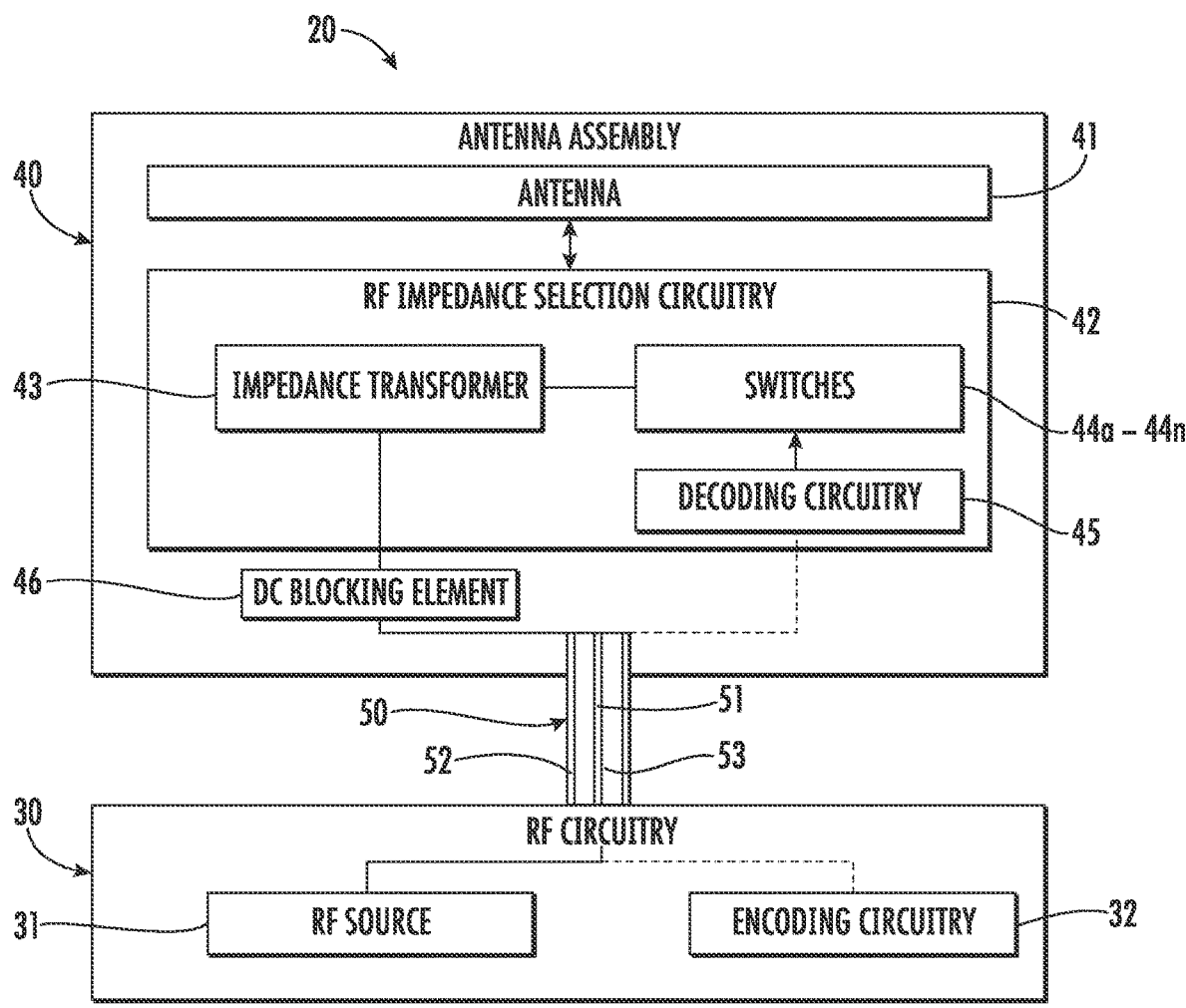
FIG. 1 is a schematic block diagram of a communications system according to an embodiment.
Figure 2:
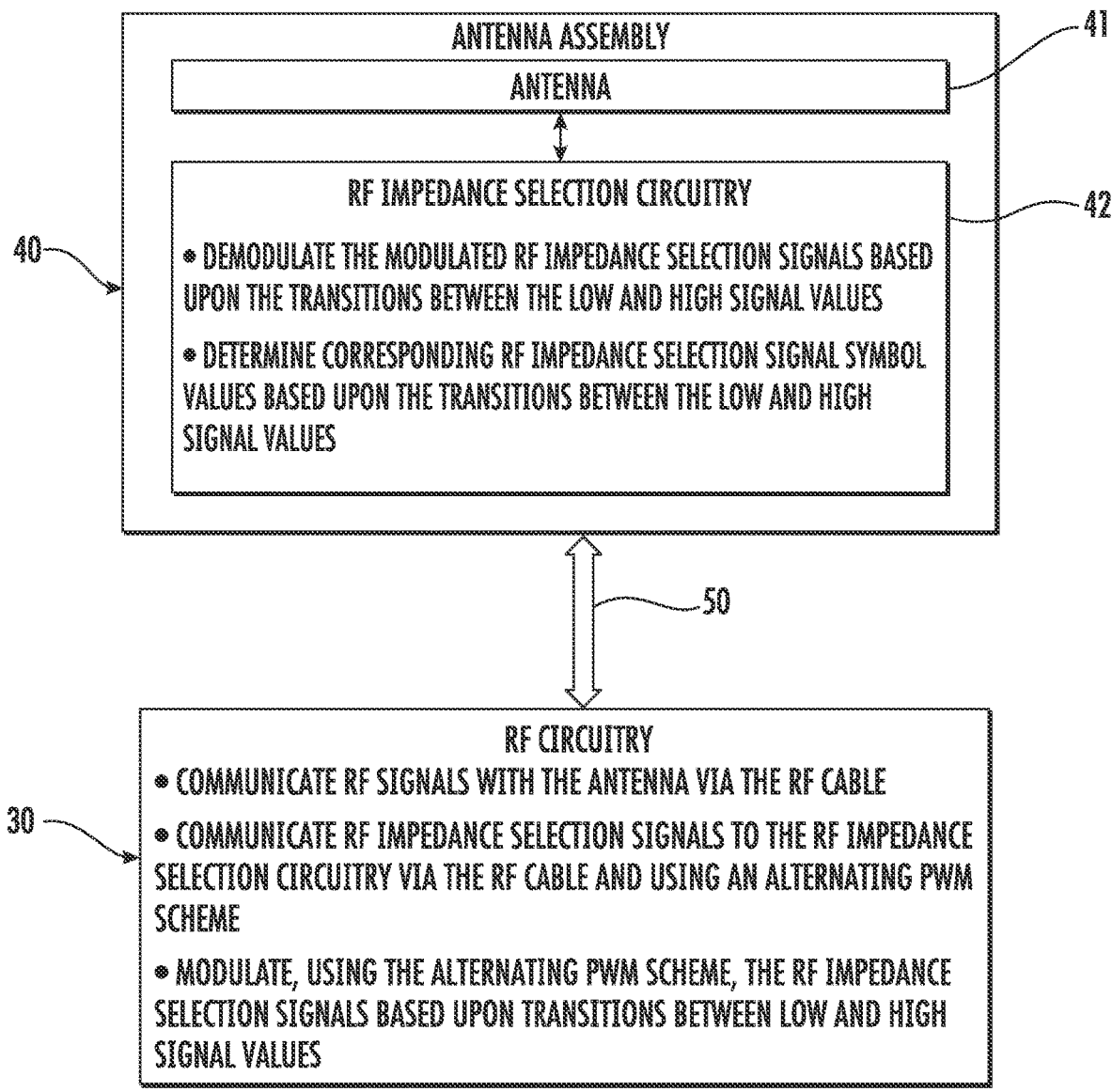
FIG. 2 is another schematic block diagram of the communications system of FIG. 1.
Figure 3:
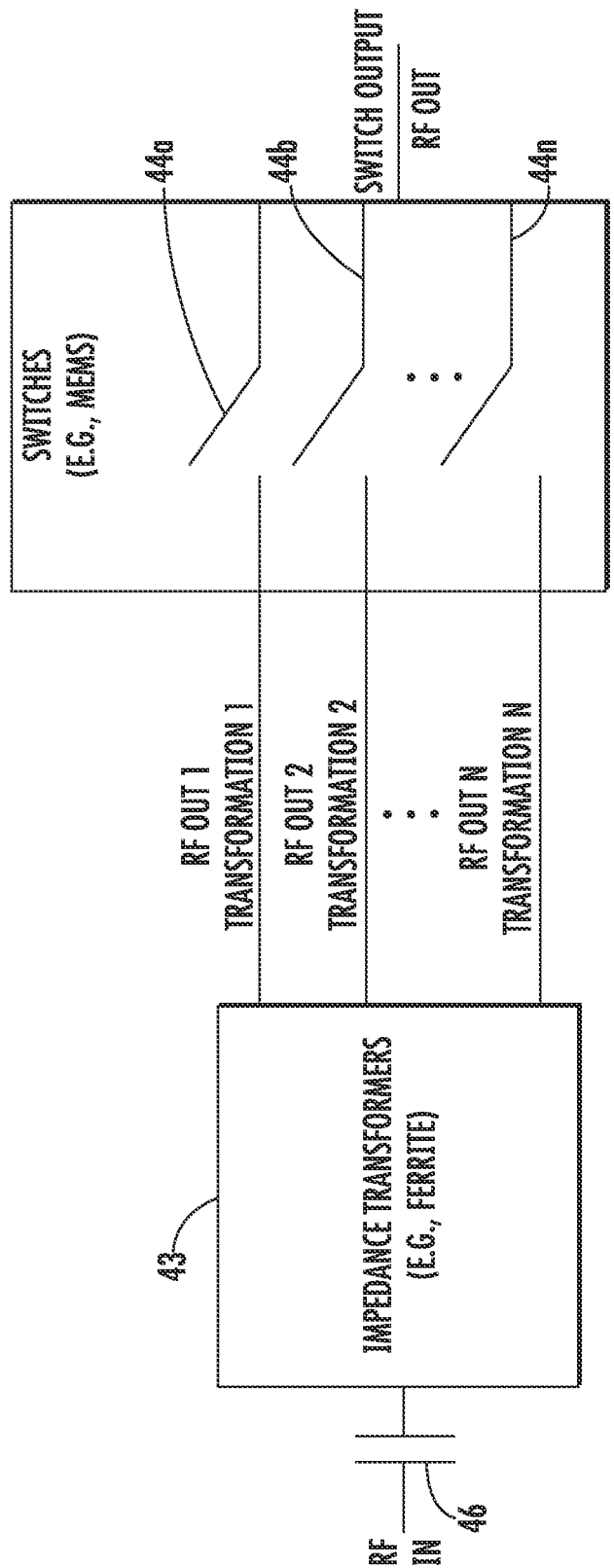
FIG. 3 is a schematic block diagram of RF impedance selection in accordance with the embodiment of FIG. 1.

Referring initially to FIGS. 1-3, a communications system 20 includes RF circuitry 30. The communications system 20 also includes an antenna assembly 40. The antenna assembly 40 includes an antenna 41 and RF impedance selection circuitry 42. The antenna assembly 40 also includes a DC blocking element 46, for example, a capacitive DC blocking element, between the impedance selection circuitry 42 and the RF cable 50. The RF impedance selection circuitry 42 illustratively includes a impedance transformer 43 and switches 44a-44n coupled to the impedance transformer. More particularly, the switches 44a-44n may be coupled to the windings of the impedance transformer 43 to define different RF output transformations. The impedance transformer 43 may be ferrite loaded, for example. The switches 44a-44n may be micro-switches, for example.

The switches 44a-44n may be in the form of microelectromechanical (MEMS) switches, for example. The switches 44a-44n may be in the form of another type of switch.

As will be appreciated by those skilled in the art, due to power handing and/or power draw, for example, impedance matching is typically performed using PIN diodes. Typical RF switches, for example, may consume too much power, for example, for a portable radio or wireless communications device application. By using MEMS switches 44a-44n, for example, power consumption may be reduced to a more acceptable amount for a portable radio or mobile wireless communications device application.

Moreover, an impedance transformer is not typically used with antennas in wireless communications devices due to its inability to process power, for example. By using a ferrite core coupled to a relatively highly efficient bootstrap mechanism, for example, the impedance transformer 43 may operate with higher power, for example, about 20 watts. Otherwise, the ferrite may attain a saturation temperature, which may be in excess of 300 degrees Celsius and cause the transformer to fail.

The communications system 20 also includes an RF cable 50 coupling the RF circuitry 30 and the antenna assembly 40. The RF cable 50 may be a coaxial cable, for example, having an inner conductor 51, an outer conductor 53, and a dielectric layer 52 therebetween.

The RF circuitry 30 is configured to communicate RF signals with the antenna 41 via the RF cable 50. The RF circuitry 30 is also configured to communicate RF impedance selection signals to the RF impedance selection circuitry 42 via the RF cable 50 and using an alternating pulse width modulation (PWM) scheme. In other words, the RF cable 50 defines a coaxial interface between the antenna assembly 40 and the RF circuitry 30 such that the RF signal is combined with direct current (DC) serial communication signals over the combined interface.

Further details of the alternating PWM scheme will now be described. The RF circuitry 30 includes an RF source 31 (e.g., baseband source) and modulation or encoding circuitry 32. The RF circuitry 30, and more particularly, the encoding circuitry 32, is configured to modulate, using the alternating PWM scheme, the RF impedance selection signals, communicated serially, based upon transitions between low and high signal values.

Typical serial protocols generally operate with 1-bit per symbol. The corresponding baud rate is determined based upon the number of symbols per second. In determining a given baud rate, start and stop bit may be included, and a typical user bit rate is about 80-percent of the baud rate (a given 10-bit frame includes 8-bits of data). For example, a 1200 baud is equal to 1200 symbols per second, which equate to 960 bits/second.

The alternating PWM scheme increases the number of bits per symbol, which increases the overall bit rate for the same baud rate. Thus, an 8-level PWM can be used to encode 3 bits per symbol. More particularly, 9-bits of data are communicated, which include 8 data bits and 1 parity bit, with 3 symbols. Also, a "jumbo" frame may be communicated instead of using a parity bit to increase, for example, maximize, transmission efficiency. Those skilled in the art will appreciate that a "jumbo" frame may include 8 conventional frames aggregated at the receiver which is decoded as a block of 9-bytes.

Figure 4:
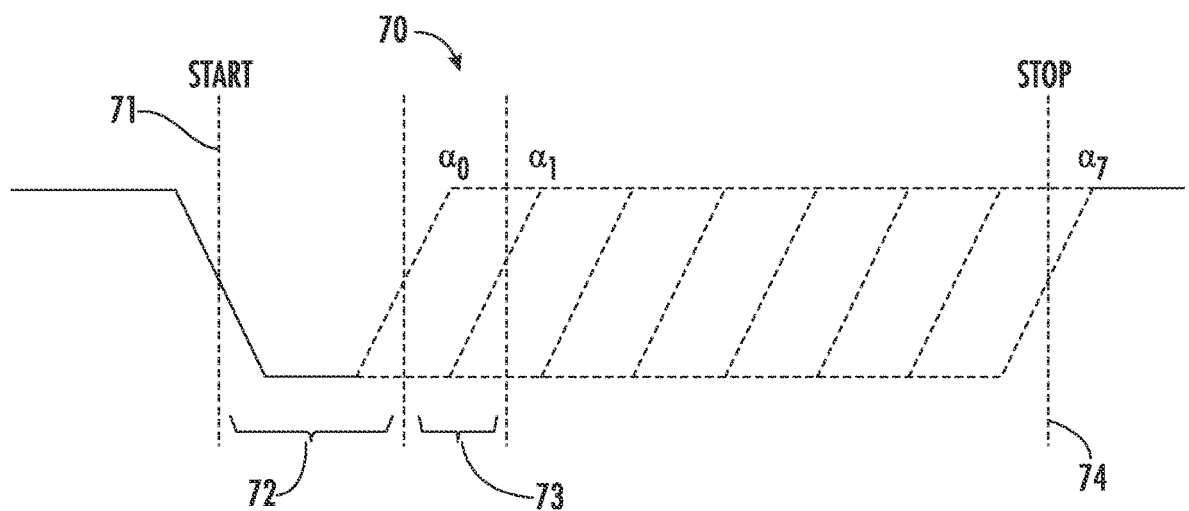
FIG. 4 is a timing diagram of a modulated symbol modulated using a communications system in accordance with an embodiment.

Referring additionally to FIG. 4, an exemplary modulated symbol 70 using the alternating PWM is illustrated. A start time is denoted by $t_{start}$ 71—a transition from logic high to logic low. The minimum symbol time is denoted by 72 with symbol spacing 73 denoted by $\alpha_0 \ldots \alpha_7$. The stop time is denoted by $t_{stop}$ 74, which corresponds to the transition from logic low to logic high.

A corresponding gray coded alphabet or look-up table may be defined as:

| Symbol | Bits | Symbol Duration |
| --- | --- | --- |
| $\alpha_0$ | 000 | Min_Symbol_Time + (0 * Symbol_Spacing) |
| $\alpha_1$ | 001 | Min_Symbol_Time + (1 * Symbol_Spacing) |
| $\alpha_2$ | 010 | Min_Symbol_Time + (2 * Symbol_Spacing) |
| $\alpha_3$ | 011 | Min_Symbol_Time + (3 * Symbol_Spacing) |
| $\alpha_4$ | 100 | Min_Symbol_Time + (4 * Symbol_Spacing) |
| $\alpha_5$ | 101 | Min_Symbol_Time + (5 * Symbol_Spacing) |
| $\alpha_6$ | 110 | Min_Symbol_Time + (6 * Symbol_Spacing) |
| $\alpha_7$ | 111 | Min_Symbol_Time + (7 * Symbol_Spacing) |

The receiver symbol timer is reset on every transition. Thus, as will be appreciated by those skilled in the art, clock drift and jitter may only impact timing with 1 symbol period versus the entire frame with conventional asynchronous serial communications schemes (e.g., UART), for example. Indeed, as illustrated, the frame length is variable since the transition resets the receiver symbol timer, which may optimize frame timing to be relatively short or as short as possible.

Figure 5:
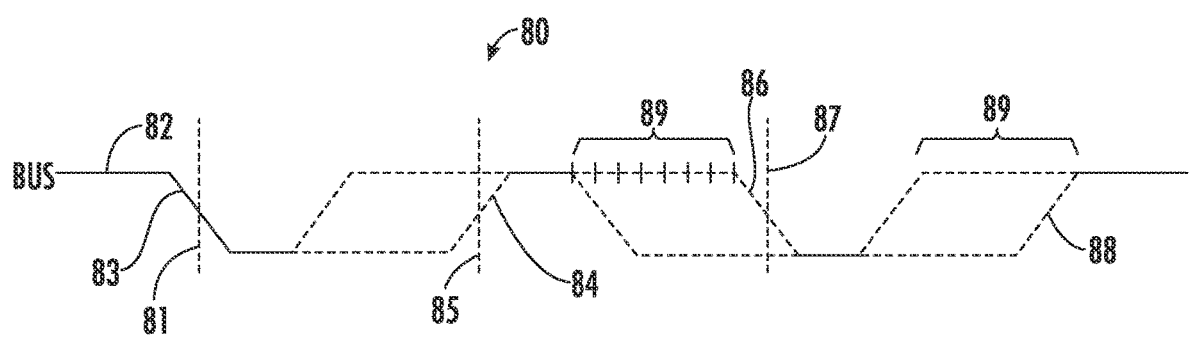
FIG. 5 is a timing diagram of alternating polarity PWM used in a communications system in accordance with an embodiment.

Referring additionally to FIG. 5, a higher level timing diagram of the alternating PWM scheme 80 is illustrated. The bus idles high 82, and the symbol start time 81 is determined based upon a transition 83 from high-to-low. The next transition 84, from low-to-high, marks the end of the first symbol and the beginning or start time of the next symbol 85, while the following transition 86 marks the end of the second symbol and the beginning of the third symbol 87, and so on before ending at the symbol end time 88. As described above, 8 transition positions map the symbol alphabet, which corresponds to the maximum symbol time 89.

Alternating the phases between symbols may reduce the total number of transitions to 4, relative to conventional PWM techniques. The alternating PWM scheme may also reduce the need for start and stop bits, thus resulting in more efficient data transmission.

Using the alternating PWM scheme may be particularly advantageous in situations where the receiver or transmitter (Rx/Tx) sampling clocks are far greater than a target bit rate of the associated bus, for example, as may be dictated by a corresponding circuit slew rate. Thus, the alternating PWM scheme may reduce, for example, minimize, the number of transitions to improve the overall frame latency. The alternating PWM scheme may also reduce electromagnetic interference (EMI) as EMI is typically produced on every transition.

Figure 6:
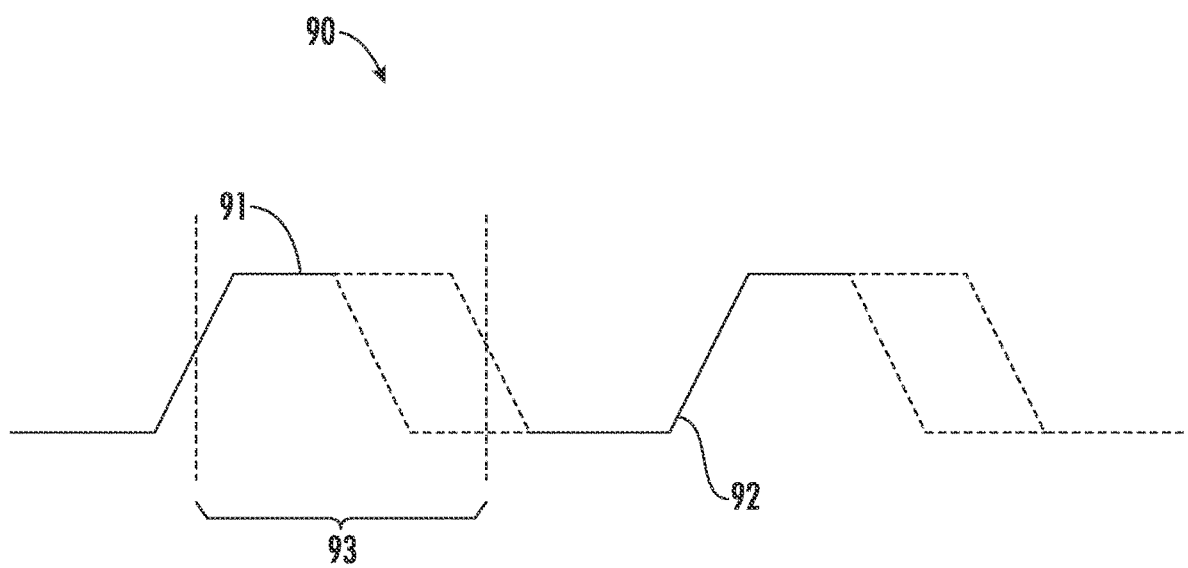
FIG. 6 is a timing diagram of conventional PWM in accordance with the prior art.

Referring briefly to FIG. 6, in contrast, a conventional PWM scheme 90 is illustrated. The pulse duration 93 in a conventional PWM scheme is typically denoted by the amount of logic "high-time" 91. Typically, 1-bit is encoded per pulse period (i.e., short v. long pulse). The bus resets back to logic high to start a next pulse period 92, which causes a wasted transition that includes no pertinent information or data.

Thus, conventional universal asynchronous receiver transmitter (UART) frames that includes 8 user or data bits, 1 start bit, and 1 stop bit, are dependent on bit sequence. A mean number of transition for all bit transitions may be 4.5 with 1.78 bits per transition. As it relates to the conventional UART frame, approximately, 36.3% of bit combinations have greater than or equal to 6 transitions per frame, while 49.2% of bit combinations have 4 transitions per frame, and 14.5% of bit combinations have less than or equal to 2 transitions per frame.

A conventional 1-wire protocol generally requires 2 transitions for each bit. Thus, an 8 bit frame corresponds to 16 transitions, with 0.5 bits per transition.

Referring again to FIGS. 1-3, the impedance selection circuitry 42, decodes or demodulates the modulated RF impedance selection signals, via a decoding circuitry 45, based upon the transitions between the low and high signal values. From the demodulated RF impedance selection signals, corresponding RF impedance selection signal symbol values are determined based upon the transitions between the low and high signal value transitions and a lookup table, as described above.

The RF impedance selection signals configure the switches 44a-44n in the corresponding positions (i.e., open or closed) to define varying degrees of impedance transformation (i.e., RF Out 1 Transformation 1 . . . RF Out X Transformation X) (FIG. 3).

With respect to impedance transformation, exemplary RF impedance selection circuitry 42 including the impedance transformer 43 and the switches 44a-44n, were used to generate sample transformation measurements. Particularly, a high impedance helix on an electrically small ground plane defined the impedance selection circuitry 42. Transformation is thus performed in reverse so 1:2, 1:3, 1:4, etc. This permitted the use of a 400-Ohm structure to approach 50-Ohms with transformation 4 (FIG. 3). By placing the states in parallel, in-between values were able to be obtained, i.e., 1:2.5, 1:3.25, for example, as shown in the parallel transformation columns in the table below.

| Frequency (MHz) | Transformation Number | | | | | |
|---|---|---|---|---|---|---|
| | 1 | 2 | 3 | 4 | 1, 2 in Parallel | 2, 3 in Parallel |
| 30 MHz | 0.47 | 0.35 | 0.27 | 0.22 | 0.39 | 0.32 |
| 40 MHz | 0.46 | 0.35 | 0.28 | 0.22 | 0.42 | 0.33 |
| 50 MHz | 0.45 | 0.35 | 0.28 | 0.23 | 0.43 | 0.33 |
| 60 MHz | 0.43 | 0.34 | 0.28 | 0.23 | 0.43 | 0.33 |
| 75 MHz | 0.39 | 0.33 | 0.28 | 0.24 | 0.41 | 0.32 |
| 90 MHz | 0.36 | 0.32 | 0.27 | 0.25 | 0.39 | 0.31 |

Figure 7:
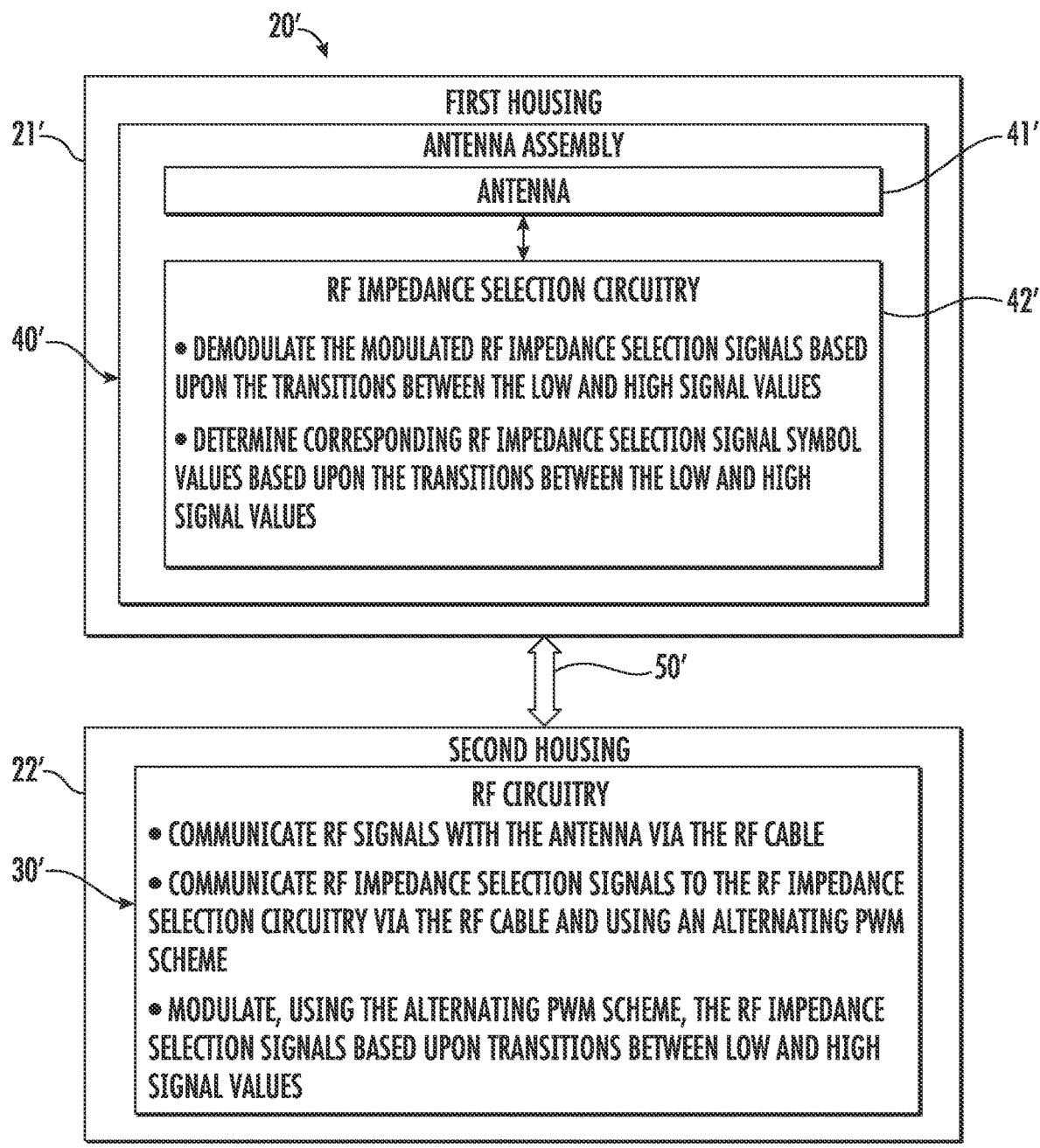
FIG. 7 is a schematic block diagram of a communications system according to another embodiment.

Referring now briefly to FIG. 7, in another embodiment, the communications system 20' may include a first housing 21' that carries the RF circuitry 30'. A second housing 22' carried the antenna assembly 40', and more particularly, the antenna 41' and the RF impedance selection circuitry 42'. Such a configuration may be advantageous for a wearable and portable wireless communications device, for example, where the antenna assembly is carried or worn on the back of a user and physically separated from RF circuitry. Of course, in some embodiments, the RF circuitry 30', the antenna assembly 40' and the RF cable 50' may be carried by a single housing. Moreover, in some embodiments, the communications system 20' may include an antenna, for example, coaxial antenna interface, rather than an antenna.

A method aspect is directed to a method of communicating using a communications system comprising radio frequency (RF) circuitry 30, an antenna assembly 40, and an RF cable 50 coupling the RF circuitry 30 and the antenna assembly 40. The method includes operating the RF circuitry 30 to communicate RF signals with an antenna 41 of the antenna assembly 40 via the RF cable 50. The method also includes operating the RF circuitry 30 to communicate RF impedance selection signals to RF impedance selection circuitry 42 of the antenna assembly 40 via the RF cable and using an alternating pulse width modulation scheme.

While several embodiments have been described herein, it should be appreciated by those skilled in the art that any element or elements from one or more embodiments may be used with any other element or elements from any other embodiment or embodiments. Many modifications and other embodiments of the invention will come to the mind of one skilled in the art having the benefit of the teachings presented in the foregoing descriptions and the associated drawings. Therefore, it is understood that the invention is not to be limited to the specific embodiments disclosed, and that modifications and embodiments are intended to be included within the scope of the appended claims.

That which is claimed is:

1. A communications system comprising:
   radio frequency (RF) circuitry, an antenna assembly, and an RF cable coupling the RF circuitry and the antenna assembly;
   the antenna assembly comprising an antenna and RF impedance selection circuitry coupled thereto;
   the RF circuitry configured to
      communicate RF signals with the antenna via the RF cable, and
      communicate RF impedance selection signals to the RF impedance selection circuitry via the RF cable and using an alternating pulse width modulation scheme.

2. The communications system of claim 1 wherein the RF impedance selection circuitry comprises an impedance transformer and a plurality of switches coupled to the impedance transformer.

3. The communications system of claim 2 wherein the plurality of switches comprises a plurality of microelectromechanical (MEMS) switches.

4. The communications system of claim 1 wherein the RF circuitry is configured to modulate, using the alternating pulse width modulation scheme, the RF impedance selection signals based upon transitions between low and high signal values.

5. The communications system of claim 4 wherein the RF impedance selection circuitry is configured to demodulate the modulated RF impedance selection signals based upon the transitions between the low and high signal values.

6. The communications system of claim 5 wherein the RF impedance selection circuitry is configured to determine corresponding RF impedance selection signal symbol values based upon the transitions between the low and high signal values and a lookup table.

7. The communications system of claim 1 wherein the antenna assembly comprises a direct current (DC) blocking element between the impedance selection circuitry and the RF cable.

8. The communications system of claim 1 wherein the RF cable comprises a coaxial cable.

9. The communications system of claim 1 comprising a first housing carrying the RF circuitry; and wherein the antenna assembly comprises a second housing carrying the antenna and RF impedance selection circuitry.

10. A communications system comprising:
radio frequency (RF) circuitry, an antenna assembly, and a coaxial cable coupling the RF circuitry and the antenna assembly;
the antenna assembly comprising an antenna, and RF selection circuitry coupled to the antenna, the RF selection circuitry comprising an impedance transformer coupled to the antenna and a plurality of switches coupled to the impedance transformer;
the RF circuitry configured to
communicate RF signals with the antenna via the coaxial cable, and
communicate RF impedance selection signals to the RF impedance selection circuitry via the RF cable and using an alternating pulse width modulation scheme.

11. The communications system of claim 10 wherein the plurality of switches comprises a plurality of microelectromechanical (MEMS) switches.

12. The communications system of claim 10 wherein the RF circuitry is configured to modulate, using the alternating pulse width modulation scheme, the RF impedance selection signals based upon transitions between low and high signal values.

13. The communications system of claim 12 wherein the RF impedance selection circuitry is configured to demodulate the modulated RF impedance selection signals based upon the transitions between the low and high signal values.

14. The communications system of claim 13 wherein the RF impedance selection circuitry is configured to determine corresponding RF impedance selection signal symbol values based upon the transitions between the low and high signal values and a lookup table.

15. The communications system of claim 10 wherein the antenna assembly comprises a direct current (DC) blocking element between the impedance selection circuitry and the RF cable.

16. The communications system of claim 10 comprising a first housing carrying the RF circuitry, and wherein the antenna assembly comprises a second housing carrying the antenna and RF impedance selection circuitry.

17. A method of communicating using a communications system comprising radio frequency (RF) circuitry, an antenna assembly, and an RF cable coupling the RF circuitry and the antenna assembly, the method comprising:
operating the RF circuitry to communicate RF signals with an antenna of the antenna assembly via the RF cable; and
operating the RF circuitry to communicate RF impedance selection signals to RF impedance selection circuitry of the antenna assembly via the RF cable and using an alternating pulse width modulation scheme.

18. The method of claim 17 further comprising operating an impedance transformer of the antenna assembly and operating a plurality of switches of the antenna assembly coupled to the impedance transformer.

19. The method of claim 18 wherein operating the plurality of switches comprises operating a plurality of microelectromechanical (MEMS) switches.

20. The method of claim 17 wherein operating the RF circuitry comprises modulating, using the alternating pulse width modulation scheme, the RF impedance selection signals based upon transitions between low and high signal values.

21. The method of claim 20 wherein operating the RF impedance selection circuitry comprises demodulating the modulated RF impedance selection signals based upon the transitions between the low and high signal values.

22. The method of claim 21 wherein using the RF impedance selection circuitry comprises determining corresponding RF impedance selection signal symbol values based upon the transitions between the low and high signal values and a lookup table.

\* \* \* \* \*